(12) United States Patent
Zhang

(10) Patent No.: US 11,742,406 B2
(45) Date of Patent: Aug. 29, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Tiantian Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 45 days.

(21) Appl. No.: 17/411,573

(22) Filed: Aug. 25, 2021

(65) Prior Publication Data

US 2022/0077297 A1 Mar. 10, 2022

(30) Foreign Application Priority Data

Sep. 9, 2020 (CN) .......................... 202010942641.4

(51) Int. Cl.
*H01L 29/45* (2006.01)
*H01L 21/285* (2006.01)
*H01L 29/40* (2006.01)

(52) U.S. Cl.
CPC ........ *H01L 29/45* (2013.01); *H01L 21/28518* (2013.01); *H01L 21/28556* (2013.01); *H01L 29/401* (2013.01)

(58) Field of Classification Search
None
See application file for complete search history.

(56) References Cited

U.S. PATENT DOCUMENTS

| | | | | |
|---|---|---|---|---|
| 5,929,526 A * | 7/1999 | Srinivasan | ........ | H01L 21/76844 257/E21.585 |
| 5,990,011 A * | 11/1999 | McTeer | ............ | H01L 21/76877 438/692 |
| 6,174,806 B1 * | 1/2001 | Thakur | ............ | H01L 21/76882 438/653 |
| 6,177,338 B1 * | 1/2001 | Liaw | ................. | H01L 21/31625 257/E21.252 |

(Continued)

FOREIGN PATENT DOCUMENTS

| | | | | |
|---|---|---|---|---|
| CN | 1694238 A | * | 11/2005 | ....... H01L 21/28518 |
| CN | 105470293 A | * | 4/2016 | ....... H01L 21/76816 |

(Continued)

*Primary Examiner* — Michael Lebentritt
(74) *Attorney, Agent, or Firm* — Anova Law Group, PLLC

(57) ABSTRACT

A semiconductor device and a fabrication method of the semiconductor device are provided. The semiconductor device includes a substrate, and a dielectric layer disposed over the substrate. The dielectric layer contains a contact hole, and a bottom of the contact hole exposes a surface of the substrate. The semiconductor device also includes a metal silicide layer disposed on the surface of the substrate exposed by the bottom of the contact hole. Further, the semiconductor device includes a barrier layer disposed on a surface of the metal silicide layer, and a plug layer disposed over the barrier layer and fully filling the contact hole.

18 Claims, 4 Drawing Sheets

(56) References Cited

U.S. PATENT DOCUMENTS

| | | | |
|---|---|---|---|
| 6,184,130 B1* | 2/2001 | Ku | H01L 23/5226 |
| | | | 438/677 |
| 2004/0043619 A1* | 3/2004 | Rhodes | H01L 27/10808 |
| | | | 257/E21.585 |
| 2004/0245635 A1* | 12/2004 | Lee | H01L 21/76889 |
| | | | 257/E21.585 |
| 2005/0236711 A1* | 10/2005 | Wang | H01L 21/76834 |
| | | | 257/751 |
| 2005/0266684 A1* | 12/2005 | Lee | H01L 21/76843 |
| | | | 438/653 |
| 2009/0004826 A1* | 1/2009 | Kim | H01L 21/8221 |
| | | | 257/E21.123 |
| 2009/0298294 A1* | 12/2009 | Chen | H01L 21/3065 |
| | | | 257/E21.252 |
| 2016/0013104 A1* | 1/2016 | Hung | H01L 21/76855 |
| | | | 257/288 |
| 2019/0273024 A1* | 9/2019 | Li | H01L 21/28518 |
| 2019/0393156 A1* | 12/2019 | Zierath | H01L 21/76843 |
| 2021/0050253 A1* | 2/2021 | Chiou | H01L 21/76895 |
| 2021/0391339 A1* | 12/2021 | Hung | H01L 21/823821 |
| 2022/0077297 A1* | 3/2022 | Zhang | H01L 23/53266 |
| 2022/0246528 A1* | 8/2022 | Choi | H01L 23/53266 |

FOREIGN PATENT DOCUMENTS

| | | | | | |
|---|---|---|---|---|---|
| CN | 105789306 A | * | 7/2016 | | H01L 21/31111 |
| CN | 108538712 A | * | 9/2018 | | H01L 21/0276 |
| CN | 108831859 A | * | 11/2018 | | H01L 21/76831 |
| DE | 102014109562 B4 | * | 3/2018 | | H01L 21/28518 |

* cited by examiner

SEMICONDUCTOR DEVICE AND FABRICATION METHOD THEREOF

CROSS-REFERENCES TO RELATED APPLICATIONS

This application claims the priority of Chinese patent application No. 202010942641.4, filed on Sep. 9, 2020, the entirety of which is incorporated herein by reference.

FIELD OF THE DISCLOSURE

The present disclosure generally relates to the field of semiconductor manufacturing technology and, more particularly, relates to a semiconductor device and a fabrication method thereof.

BACKGROUND

With the rapid development of semiconductor manufacturing technology, semiconductor devices have been developed towards having higher component density and higher integration degree. As the most basic semiconductor device, transistors have been widely used currently. A conventional planar transistor has substantially weak control ability on channel current, which causes a short channel effect and leads to a leakage current, and ultimately affects the electrical performance of the semiconductor device.

In a manufacturing process of the semiconductor device, the current conduction is often achieved through a metal connection structure, and then the specific function of the semiconductor device is achieved. Different semiconductor devices are often connected through metal plugs, which are connected to a gate and a source-drain region, respectively. However, the formation quality of the formed metal plug is poor, which causes poor electrical performance of the formed semiconductor device.

How to form a high-quality metal plug to ensure the formed semiconductor device with desired performance is an urgent technical problem that needs to be solved. The disclosed methods and device structures are directed to solve one or more problems set forth above and other problems.

BRIEF SUMMARY OF THE DISCLOSURE

One aspect of the present disclosure includes a semiconductor device. The semiconductor device includes a substrate, and a dielectric layer disposed over the substrate. The dielectric layer contains a contact hole, and a bottom of the contact hole exposes a surface of the substrate. The semiconductor device also includes a metal silicide layer disposed on the surface of the substrate exposed by the bottom of the contact hole. Further, the semiconductor device includes a barrier layer disposed on a surface of the metal silicide layer, and a plug layer disposed over the barrier layer and fully filling the contact hole.

Optionally, the semiconductor device further includes an adhesion layer disposed between the barrier layer and the plug layer.

Optionally, a thickness of the adhesion layer is in a range of approximately 5 Å-15 Å.

Optionally, the barrier layer is made of a material including a titanium-silicon alloy or a cobalt-titanium alloy.

Optionally, the plug layer is made of a material including tungsten.

Another aspect of the present disclosure includes a fabrication method of a semiconductor device. The method includes forming a dielectric layer on a substrate, and forming a contact hole in the dielectric layer by etching the dielectric layer. A bottom of the contact hole exposes a surface of the substrate. The method also includes forming a metal silicide layer and a barrier layer over the substrate exposed by the bottom of the contact hole. The barrier layer covers a surface of the metal silicide layer. Further, the method includes forming a plug layer over the barrier layer, where the plug layer fully fills the contact hole.

Optionally, forming the metal silicide layer and the barrier layer includes forming a metal layer on the surface of the substrate exposed by the bottom of the contact hole, forming a reaction layer on the metal layer, and after forming the plug layer over the reaction layer, performing an annealing treatment to form the metal silicide layer on the surface of the substrate and the barrier layer covering the metal silicide layer.

Optionally, the reaction layer is made of silane, silicon or cobalt.

Optionally, when the reaction layer is made of silane, process parameters for forming the reaction layer include a gas including silane, where a flow rate of silane is in a range of approximately 100 sccm-3000 sccm, a reaction temperature in a range of approximately 200° C.-500° C., and a reaction pressure in a range of approximately 5 torr-50 torr.

Optionally, when the reaction layer is made of silicon or cobalt, forming the reaction layer includes a chemical vapor deposition process, an atomic layer deposition process, or a physical vapor deposition process.

Optionally, before forming the plug layer, the method further includes forming an adhesion layer on the barrier layer and on a sidewall of the contact hole.

Optionally, forming the plug layer includes forming a plug seed layer on the adhesion layer, forming an initial plug layer on the plug seed layer, and planarizing the initial plug layer, the plug seed layer and the adhesion layer until a surface of the dielectric layer is exposed, to form the plug layer in the contact hole.

Optionally, a thickness of the adhesion layer is in a range of approximately 5 Å-15 Å.

Optionally, a thickness of the plug seed layer is less than 15 Å.

Optionally, after forming the adhesion layer and before forming the plug layer, an annealing treatment is performed on the substrate to form the metal silicide layer on the surface of the substrate.

Optionally, process parameters of the annealing treatment include a gas including nitrogen, where a flow rate of nitrogen is in a range of approximately 500 sccm-3000 sccm, and a temperature in a range of approximately 600° C.-1200° C.

Optionally, the plug layer is made of a material including tungsten.

Optionally, the metal layer is made of a material including titanium.

Optionally, the barrier layer is made of a material including titanium-silicon alloy or a cobalt-titanium alloy.

Optionally, forming the contact hole includes one or more of a dry etching process and a wet etching process.

The disclosed embodiments may have following beneficial effects. In the disclosed embodiments of the present disclosure, the barrier layer may be formed on the metal silicide layer, and the barrier layer may cover the surface of the metal silicide layer. The plug layer may be formed on the barrier layer, and the plug layer may fully fill the contact hole. The metal silicide layer may be isolated from the plug layer by the barrier layer, which may prevent the metal silicide layer from reacting with the diffusion ions in the plug layer to cause damages on the plug layer, thereby improving the quality of the formed plug layer, and improving the electrical performance and use performance of the formed semiconductor device.

Further, forming the metal silicide layer and the barrier layer may include: forming the metal layer on the surface of the substrate exposed by the contact hole, forming the reaction layer on the metal layer, forming the plug layer over the reaction layer, and performing an annealing treatment after forming the plug layer. Therefore, a high-quality plug layer may be formed, and the electrical performance and use performance of the formed semiconductor device may be improved. After the metal layer is formed on the surface of the substrate, the metal layer may interact with the substrate to form the metal silicide layer. In view of this, there may be the remaining metal layer, and the remaining metal layer may continue to react with the reaction layer, thereby using up the remaining metal layer. Therefore, the remaining metal layer may not react with the diffusion ions in the plug layer, which may effectively prevent damages on the plug layer due to the reaction between the diffusion ions and the remaining metal layer, thereby improving the quality of the formed plug layer, and accordingly, improving the electrical performance and use performance of the formed semiconductor device.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

In the process of forming metal plugs using a metal layer, the metal layer has poor quality and tends to have cracks, and, thus, the formed metal plug has substantially poor quality, which affects the electrical performance and usability of the semiconductor device, and limits the application of the semiconductor device. FIGS. 1-5 illustrate semiconductor structures corresponding to certain stages for forming a semiconductor device.

Figure 1:
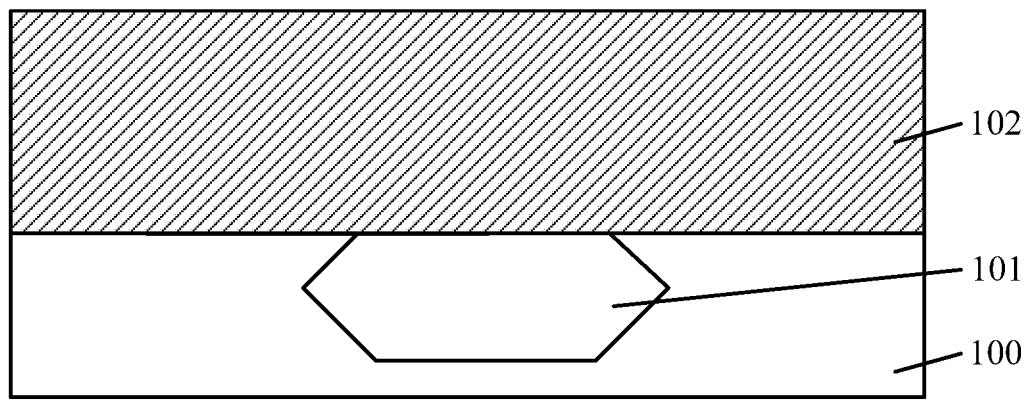
FIGS. 1-5 illustrate semiconductor structures corresponding to certain stages for forming a semiconductor device.

Referring to FIG. 1, a substrate 100 is provided, a source-drain doped layer 101 is formed in the substrate 100, and a dielectric layer 102 is formed over the substrate 100 and the source-drain doped layer 101.

Figure 2:
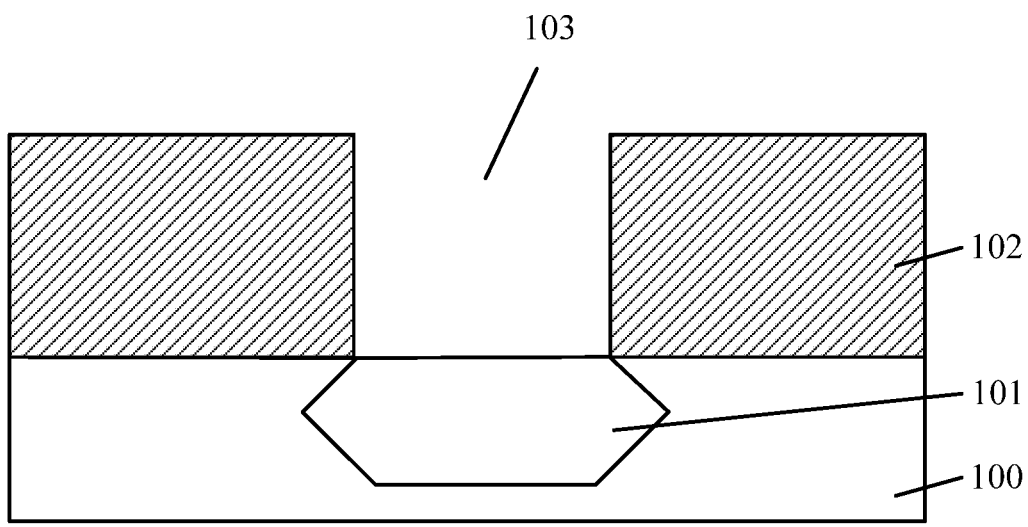

Referring to FIG. 2, the dielectric layer 102 is etched to form a contact hole 103 in the dielectric layer 102. A bottom of the contact hole 103 exposes a top surface of the source-drain doped layer 101.

Figure 3:
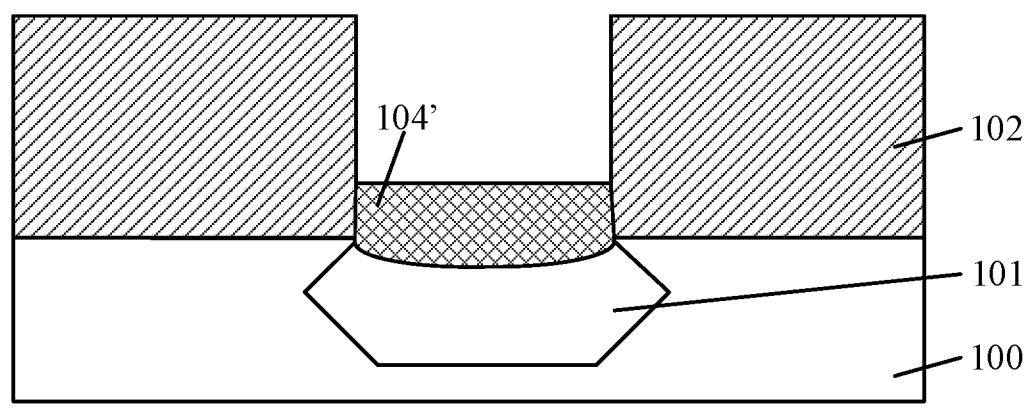

Referring to FIG. 3, a titanium layer 104' is formed on the top surface of the source-drain doped layer 101 exposed by the bottom of the contact hole 103.

Figure 4:
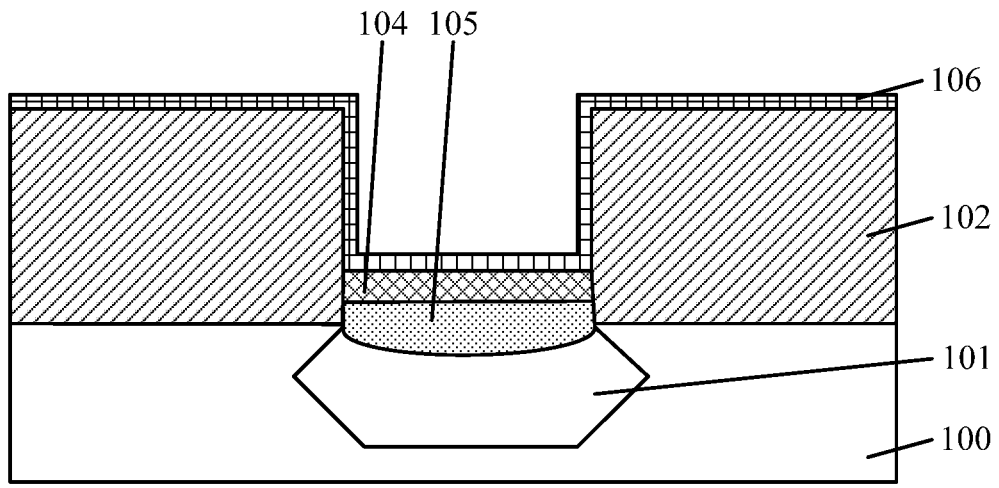

Referring to FIG. 4, an adhesion layer 106 is formed on the titanium layer 104' and on a sidewall of the contact hole 103.

After the adhesion layer 106 is formed, an annealing treatment is performed, such that the titanium layer 104' reacts with the substrate 100 and the source-drain doped layer 101 to form a metal silicide layer 105 on the surface of the source-drain doped layer 101. Further, there is a remaining titanium layer 104.

Figure 5:
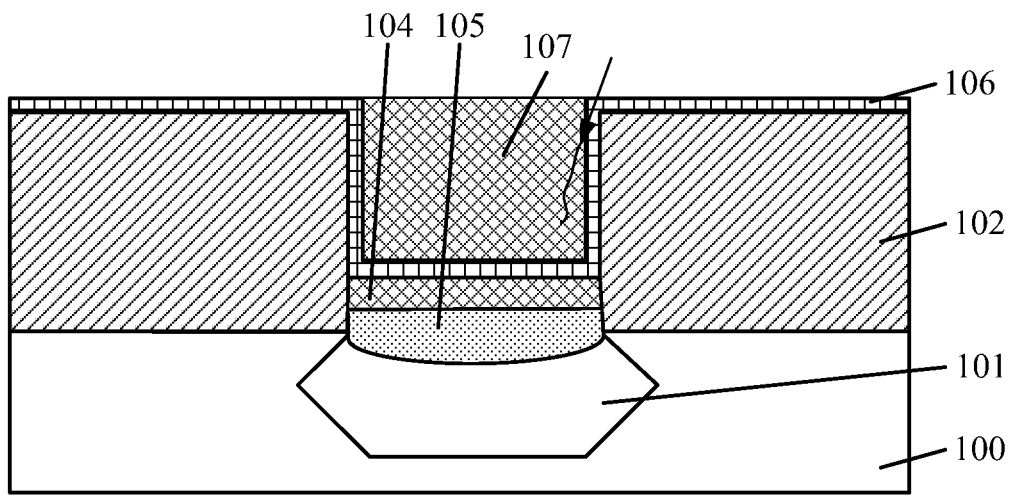

Referring to FIG. 5, a plug layer 107 is formed on the adhesion layer 106.

The stability of the use performance of the semiconductor device formed by such method is poor and failure phenomena tends to occur, which limit the application of the semiconductor device. This is because after the titanium layer 104' is formed on the top surface of the source-drain doped layer 101, and the titanium layer 104' reacts with the substrate and the source-drain doped layer 101 to form the metal silicide layer 105, there is still the remaining titanium layer 104. After the plug layer 107 is formed, the diffusion ions in the plug layer 107, such as F ions, react violently with the remaining titanium layer 104, thereby causing explosion in the plug layer 107 (i.e., the part pointed by the arrow in FIG. 5). Therefore, the plug layer 107 has a substantially poor quality, and correspondingly, the electrical performance and use performance of the formed semiconductor device are reduced.

Figure 9:
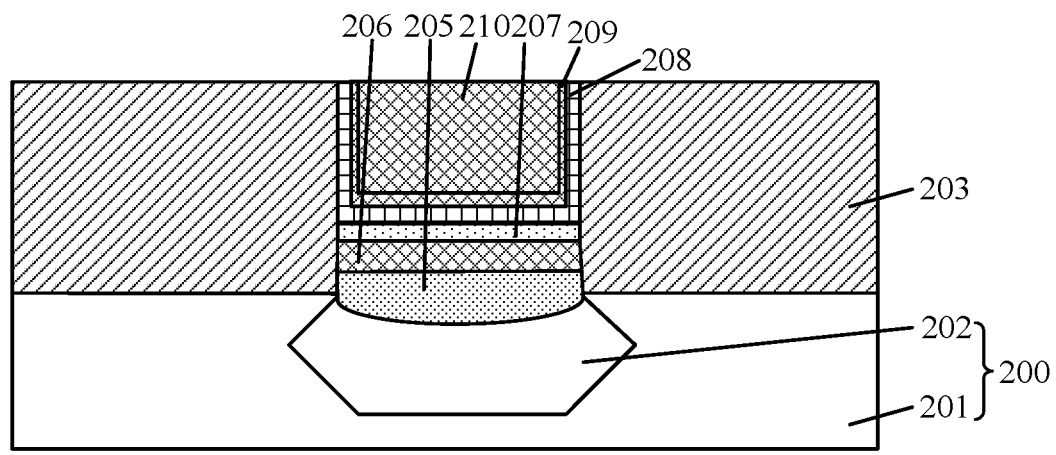
Figure 10:
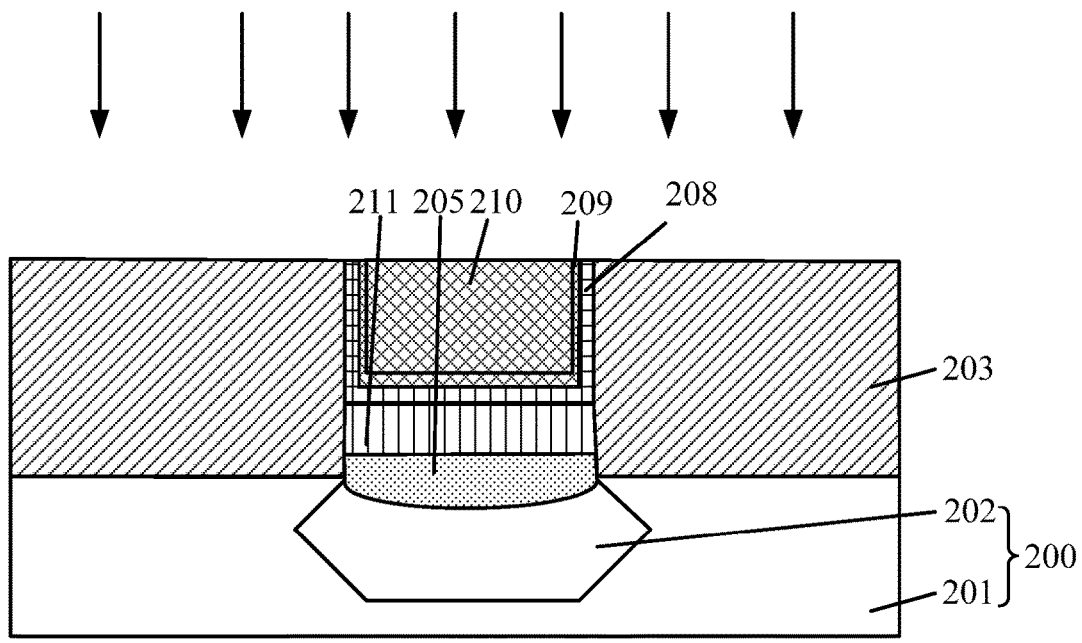
Figure 11:
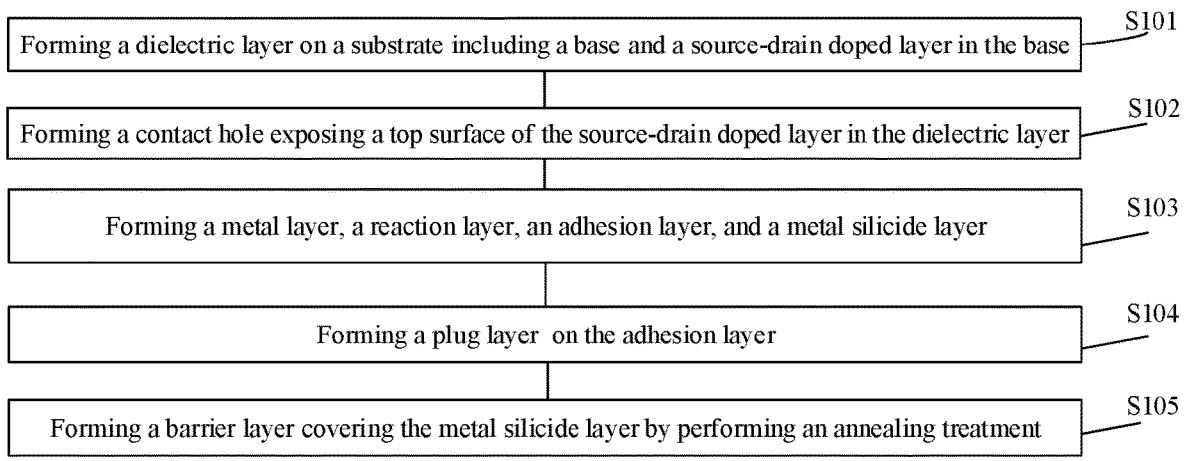
FIG. 11 illustrates a flowchart of an exemplary fabrication method of a semiconductor device consistent with various disclosed embodiments of the present disclosure.

The present disclosure provides a semiconductor device and a fabrication method thereof. FIG. 11 illustrates a flowchart of a method for forming a semiconductor device consistent with various disclosed embodiments of the present disclosure, and FIGS. 6-10 illustrate semiconductor structures corresponding to certain stages of the fabrication method.

Figure 6:
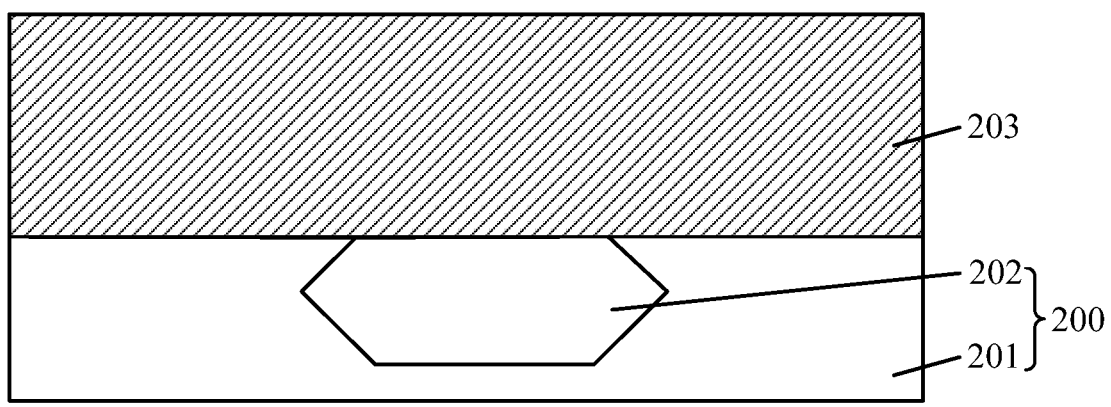
FIGS. 6-10 illustrate semiconductor structures corresponding to certain stages for forming an exemplary semiconductor device consistent with various disclosed embodiments of the present disclosure.

As shown in FIG. 11, at the beginning of the fabrication method, a dielectric layer may be formed on a substrate including a base and a source-drain doped layer in the base (S101). FIG. 6 illustrates a corresponding semiconductor structure.

Referring to FIG. 6, a dielectric layer 203 may be formed on a substrate 200. In one embodiment, the substrate 200 may include a base 201 and a source-drain doped layer 202 in the base 201.

In one embodiment, the base 201 may be made of monocrystalline silicon. In another embodiment, the base 201 may be made of polysilicon, amorphous silicon, germanium, silicon germanium, silicon on insulator (SOI), germanium on insulator (GOI), or any other semiconductor material. In certain embodiments, the base may be made of multi-element semiconductor materials composed of group III-V elements, including InP, GaAs, GaP, InAs, InSb, InGaAs or InGaAsP, etc.

In one embodiment, devices such as a fin and a gate structure may also be formed on the base 201, which may not be illustrated in the Figure.

In one embodiment, forming the source-drain doped layer 202 may include: etching the base 201 to form a source-drain groove (not shown in the Figure) in the base 201; epitaxially growing a material of the source-drain doped layer in the source-drain groove; and performing an in-situ doping process with source-drain doped ions on the material of the source-drain doped layer to form the source-drain doped layer 202.

In one embodiment, when the semiconductor device is a P-type device, the source-drain doped layer 202 may be made of a material including silicon, germanium, or silicon germanium. The source-drain doped ions may include P-type ions including boron ions, $BF^{2-}$ ions, or indium ions.

When the semiconductor device is an N-type device, the source-drain doped layer 202 may be made of a material including silicon, gallium arsenide, or indium gallium arsenide. The source-drain doped ions may include N-type ions including phosphorus ions, or arsenic ions.

In one embodiment, the dielectric layer 203 may be made of silicon carbide. In certain embodiments, the dielectric layer 203 may be made of an insulating material such as silicon nitride, silicon oxide, or silicon oxy-carbide, etc.

In one embodiment, forming the dielectric layer 203 may include: forming an initial dielectric layer on the surfaces of the base 201 and the source-drain doped layer 202, and planarizing the initial dielectric layer to have the surface of the initial dielectric layer been flush, to form the dielectric layer 203.

In one embodiment, forming the dielectric layer 203 may include a chemical vapor deposition process. In another embodiment, the dielectric layer 203 may be formed by one or more of an atomic layer deposition process, a physical vapor deposition process, and a chemical vapor deposition process.

In one embodiment, process parameters for forming the dielectric layer 203 may include: gases including hydrogen, HCl, $SiH_2Cl_2$ and $PH_3$, where a flow rate of hydrogen is in a range of approximately 2000 sccm-20000 sccm, a flow rate of HCl is in a range of approximately 30 sccm-150 sccm, a flow rate of $SiH_2Cl_2$ is in a range of approximately 50 sccm-1000 sccm, and a flow rate of $PH_3$ is in a range of approximately 10 sccm-2000 sccm, a chamber pressure in a range of approximately 10 torr-600 torr, and a temperature in a range of approximately 650° C.-850° C.

Figure 7:
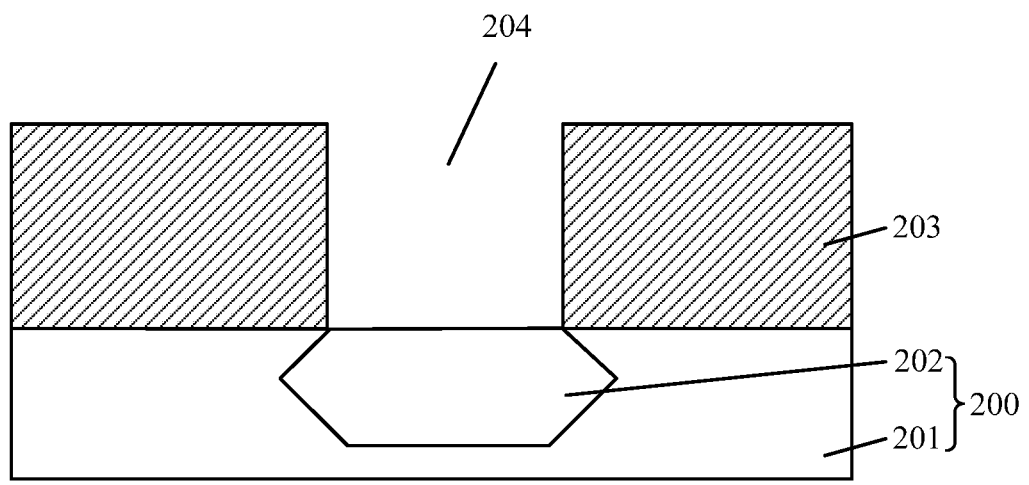

Returning to FIG. 11, after forming the dielectric layer, a contact hole exposing a top surface of the source-drain doped layer may be formed in the dielectric layer (S102). FIG. 7 illustrates a corresponding semiconductor structure.

Referring to FIG. 7, the dielectric layer 203 may be etched to form a contact hole 204 in the dielectric layer 203, to expose the surface of the substrate 200. In one embodiment, a bottom of the contact hole 204 may expose a top surface of the source-drain doped layer 202.

In one embodiment, forming the contact hole 204 may include: forming a patterned layer (not shown in the Figure) on the dielectric layer 203, where the patterned layer may have an opening, and the opening may be aligned with a position of the source-drain doped layer 201; and by using the patterned layer as a mask, etching the dielectric layer 203 until the top surface of the source-drain doped layer 202 is exposed.

In one embodiment, etching the dielectric layer 203 may include a dry etching process. In another embodiment, etching the dielectric layer 203 may include a wet etching process, or a combination of a wet etching process and a dry etching process.

In one embodiment, the reason of using a dry etching process to etch the dielectric layer 203 to form the contact hole 204 may include following. The dry etching process may have a longitudinal etching rate greater than a horizontal etching rate, such that the contact hole 204 with desired surface quality may be formed in the longitudinal direction without causing damages to any other device in the horizontal direction.

In one embodiment, specific parameters of the dry etching process may include: gases including $CF_4$, $CH_3F$ and $O_2$, where a flow rate of $CF_4$ is in a range of approximately 5 sccm-100 sccm, a flow rate of $CH_3F$ is in a range of approximately 8 sccm-50 sccm, and a flow rate of $O_2$ is in a range of approximately 10 sccm-100 sccm, a chamber pressure in a range of approximately 10 mtorr-2000 mtorr, a radio frequency (RF) power in a range of approximately 50 W-300 W, a bias voltage in a range of approximately 30 V-100 V, and a duration in a range of approximately 4 seconds-50 seconds.

Then, a metal silicide layer and a barrier layer may be formed over the surface of the substrate exposed by the bottom of the contact hole, and the barrier layer may cover the surface of the metal silicide layer. The formation process of the metal silicide layer and the barrier layer may refer to FIGS. 8-10.

Figure 8:
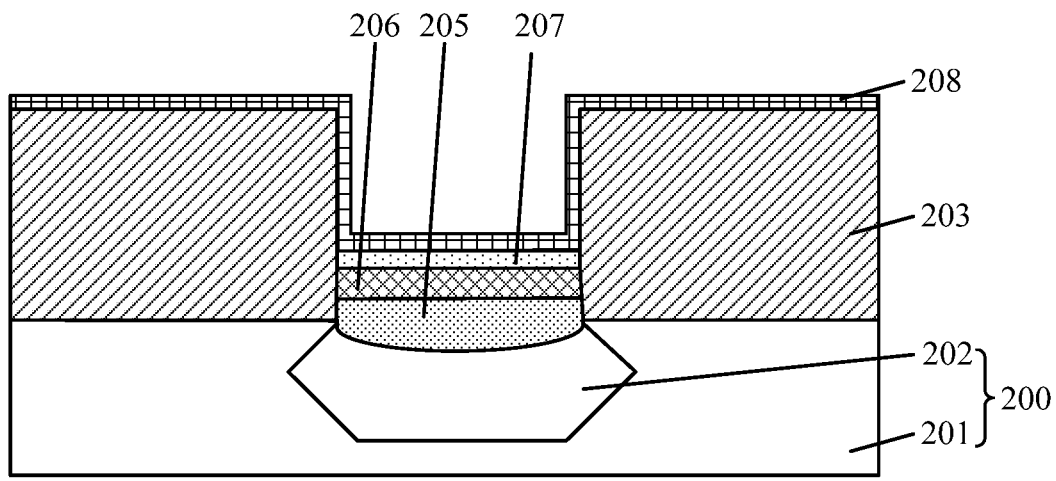

Returning to FIG. 11, after forming the contact hole, a metal layer, a reaction layer, an adhesion layer, and a metal silicide layer may be formed (S103). FIG. 8 illustrates a corresponding semiconductor structure.

Referring to FIG. 8, a metal layer may be formed on the surface of the substrate 200 exposed by the bottom of the contact hole 204, a reaction layer 207 may be formed on the metal layer, and an adhesion layer 208 may be formed on the reaction layer 207 and the sidewall of the contact hole 204. In one embodiment, the metal layer may be configured to provide a metal source for forming the metal silicide layer.

In one embodiment, after forming the adhesion layer 208 and before forming a plug layer, a thermal treatment may be performed on the substrate to form a metal silicide layer 205 on the surface of the substrate (i.e., on the top surface of the source-drain doped layer 202).

In another embodiment, after forming the plug layer, the metal silicide layer 205 may be formed on the top surface of the source-drain doped layer 202 in an annealing treatment.

In one embodiment, due to the interaction between the metal layer and the substrate, the metal silicide layer 205 may be formed on the exposed top surface of the source-drain doped layer 202.

In one embodiment, forming the metal silicide layer 205 may include: forming a metal layer (marked in the Figure) on the top surface of the source-drain doped layer 202, and after forming the metal layer, performing a rapid thermal annealing (RTA) process on the substrate to form the metal silicide layer 205.

Because the metal layer is not fully used up during the process of forming the metal silicide layer 205, there may be a remaining metal layer 206.

In one embodiment, the metal layer may be made of a material including titanium (Ti). In another embodiment, the metal layer may be made of a material including cobalt, or NiPt, etc.

The reason of using titanium (Ti) to form the metal layer may include following. The metal layer made of titanium may be applied to the production of semiconductor devices with a substantially small node or a substantially small feature dimension, and the diffusion direction of titanium in the semiconductor device may be deterministic and controllable. Cobalt and NiPt may not be applied to the production of semiconductor devices with a substantially small node or a substantially small feature dimension, and the diffusion direction of cobalt and NiPt may be uncertain and may be difficult to control.

In one embodiment, the metal layer may be made of elemental titanium. In other words, the remaining metal layer 206 may be made of titanium. In one embodiment, the reaction layer 207 may be formed on the remaining metal layer 206. In one embodiment, the reaction layer 207 may be made of a material including silane, silicon or cobalt.

When the reaction layer 207 is made of silane ($SiH_4$), process parameters for forming the reaction layer 207 may include: gas including silane, where a flow rate of silane is in a range of approximately 100 sccm-3000 sccm, a reaction temperature in a range of approximately 200° C.-500° C., and a reaction pressure in a range of approximately 5 torr-50 torr.

In one embodiment, the silane ($SiH_4$) may crack at a high temperature to form elemental silicon. In the subsequent annealing treatment, the formed elemental silicon may chemically react with the remaining metal layer 206, and, thus, the remaining metal layer 206 may be used up. In view of this, the process where the remaining metal layer 206 reacts with the diffusion ions (such as F ions) in the subsequently formed plug layer may be prevented, to avoid damages on the formed plug layer due to the violent reaction between the remaining metal layer 206 and the diffusion ions, thereby improving the quality of the subsequently formed plug layer.

When the reaction layer 207 is made of silicon or cobalt, forming the reaction layer may include a chemical vapor deposition process, an atomic layer deposition process, or a physical vapor deposition process.

When the reaction layer 207 is made of silicon or cobalt, forming the reaction layer may include a physical vapor deposition process. Specific parameters of the physical vapor deposition process may include: silicon or cobalt as a target material, a reaction gas of argon (Ar), where a flow rate of the reaction gas is in a range of approximately 50 sccm-500 sccm, a source radio frequency power in a range of approximately 100 W-500 W, a bias power in a range of approximately 500 W-5000 W, and a chamber pressure in a range of approximately 10 mtorr-100 mtorr.

In one embodiment, the reason of using a physical vapor deposition process to form the reaction layer 207 may include following. Using the physical vapor deposition process, the reaction layer 207 may be rarely formed on the dielectric layer 203 and on the sidewall of the contact hole 204, and, thus, additional processes for removing excess reaction layer 207 may not be needed, which may simplify the process and reduce damages on the device.

In one embodiment, in the subsequent annealing process, the deposited silicon may chemically react with the remaining metal layer 206 to form a titanium-silicon alloy, and, thus, the remaining metal layer 206 may be used up, which may avoid damages on the formed plug layer due to the violent reaction between the remaining metal layer 206 and the diffusion ions, thereby improving the quality of the subsequently formed plug layer.

In one embodiment, in the subsequent annealing treatment, the deposited cobalt may react with the remaining metal layer 206 to form a cobalt-titanium alloy. Such cobalt-titanium alloy may have a substantially high density and may isolate the remaining metal layer 206 from the diffusion ions. The remaining metal layer 206 may be prevented from being in contact with the diffusion ions, which may avoid the violent reaction between the remaining metal layer 206 and the diffusion ions, may not cause damages on the formed plug layer, and may improve the quality of the subsequently formed plug layer.

In one embodiment, the adhesion layer 208 may be made of titanium nitride (TiN). In another embodiment, the adhesion layer 208 may be made of TaN, etc.

In one embodiment, the adhesion layer 208 may serve as a transition layer to provide a desired formation interface for subsequently formed plug layer, thereby improving the quality of the ultimately formed plug layer. In addition, the adhesion layer 208 may block the diffusion ions in the plug layer, and may prevent metal atoms of the plug layer from diffusing into the dielectric layer.

In one embodiment, because the reaction layer 207 is formed before forming the adhesion layer 208, the reaction layer 207 may use up the remaining metal layer 206 or may isolate the remaining metal layer 206 from the diffusion ions in the subsequently formed plug layer. Therefore, the remaining metal layer 206 may not react with the diffusion ions, and, thus, the diffusion ions in the plug layer may be blocked. In view of this, the thickness of the adhesion layer 208 may be correspondingly reduced, and the Rs value and Rc value of the formed semiconductor device may be reduced, thereby improving the electrical performance of the formed semiconductor device.

In one embodiment, the thickness of the adhesion layer 208 may be in a range of approximately 5 Å-15 Å. When the thickness of the adhesion layer 208 is less than 5 Å, the thickness of the formed adhesion layer 208 may be too thin and may not serve as the transition layer when forming the plug layer, the formed plug layer may not be sufficiently adhered to the surface of the contact hole 204, and a gap may be formed, which may cause poor quality of the formed plug layer, may not prevent the metal atoms of the plug layer from diffusing into the dielectric layer, and may affect the quality of the ultimately formed semiconductor device. When the thickness of the adhesion layer 208 is greater than 15 Å, the thickness of the formed adhesion layer 208 may be too thick, although the adhesion layer may serve as a desired transition layer to provide a desired formation interface for subsequently formed plug layer and to prevent metal atoms of the plug layer from diffusing into the dielectric layer, the Rs value and Rc value of the formed semiconductor device may increase, thereby reducing the electrical performance of the formed semiconductor device.

Returning to FIG. 11, after forming the adhesion layer, a plug layer may be formed on the adhesion layer (S104). FIG. 9 illustrates a corresponding semiconductor structure.

Referring to FIG. 9, a plug layer 210 may be formed on the adhesion layer 208, and the plug layer 210 may fully fill the contact hole 204.

Forming the plug layer 210 may include: forming a plug seed layer 209 on the adhesion layer 208, forming an initial plug layer on the plug seed layer 209, and planarizing the initial plug layer, the plug seed layer 209 and the adhesion layer 208 until the surface of the dielectric layer 203 is exposed, to form the plug layer 210 in the contact hole 204.

In the actual process, after the initial plug layer is formed, the plug seed layer 209 may be integrated with the initial plug layer as an entity. For illustrative purposes, to clearly illustrate the formation process of the plug layer 210, the plug seed layer 209 may be marked in FIG. 9.

In one embodiment, a thickness of the plug seed layer 209 may be less than 15 Å. Due to the existence of the reaction layer 207, the thickness of the plug seed layer 209 may be reduced, which may be because the reaction layer 207 may block the damages on the plug layer 210 caused by the reaction between the diffusion ions in the plug layer 210 and the remaining metal layer 206. The plug seed layer 209 may also block the diffusion ions in the plug layer 210, because the diffusion ions have been blocked before the plug seed layer 209 is formed, the thickness of the plug seed layer 209 may be correspondingly reduced, which may provide space for forming the plug layer 210, may increase the volume of the formed plug layer 210, and may facilitate to reduce the values of Rs and Rc, thereby improving the electrical performance of the semiconductor device.

In one embodiment, forming the initial plug layer may include a chemical vapor deposition process. In another embodiment, forming the initial plug layer may include one or more of a selective growth process, a physical vapor deposition process, an atomic layer deposition process, and a chemical vapor deposition process.

The plug seed layer 209 may be made of a same material as the plug layer 210. In one embodiment, the plug layer 210 may be made of a material including tungsten.

In one embodiment, process parameters for forming the plug layer 210 may include: reaction gases including $WF_6$ and $H_2$, where a flow rate of $WF_6$ is in a range of approximately 50 sccm-1000 sccm, and a flow rate of $H_2$ is in a range of approximately 500 sccm-20000 sccm, a reaction temperature in a range of approximately 100° C.-400° C., and a chamber pressure in a range of approximately 2 torr-100 torr.

Because $WF_6$ gas is used in the process of forming the plug layer 210, the formed plug layer 210 may contain diffusion ions, such as F ions.

In one embodiment, because the thicknesses of the adhesion layer 208 and the plug seed layer 209 are reduced, the volume of the formed plug layer 210 may increase, such that the contact resistance may be reduced, thereby improving the electrical performance of the formed semiconductor device.

Returning to FIG. 11, after forming the plug layer, a barrier layer covering the metal silicide layer may be formed by performing an annealing treatment (S105). FIG. 10 illustrates a corresponding semiconductor structure.

Referring to FIG. 10, after the plug layer 210 is formed, an annealing treatment may be performed. In one embodiment, arrows in FIG. 10 may indicate the annealing treatment.

In one embodiment, specific process parameters of the annealing treatment may include: gas including nitrogen, where a flow rate of nitrogen is in a range of approximately 500 sccm-3000 sccm, and a temperature in a range of approximately 600° C.-1200° C.

In one embodiment, in the annealing treatment, when the reaction layer 207 is made of silane ($SiH_4$), the silane ($SiH_4$) may crack at a high temperature to form elemental silicon. The formed elemental silicon may chemically react with the remaining metal layer 206, and, thus, the remaining metal layer 206 may be used up. In view of this, the process where the remaining metal layer 206 reacts with the diffusion ions (such as F ions) in the plug layer 210 may be prevented, which may avoid damages on the plug layer 210 due to the violent reaction between the remaining metal layer 206 and the diffusion ions, thereby improving the quality of the formed plug layer, and accordingly, improving the performance of the formed semiconductor device.

In one embodiment, in the annealing treatment, when the reaction layer 207 is made of silicon, elemental silicon may chemically react with the remaining metal layer 206, and, thus, the remaining metal layer 206 may be used up. In view of this, the process where the remaining metal layer 206 reacts with the diffusion ions (such as F ions) in the plug layer 210 may be prevented, which may avoid damages on the plug layer 210 due to the violent reaction between the remaining metal layer 206 and the diffusion ions.

In one embodiment, when the reaction layer 207 is made of cobalt, cobalt may react with the remaining metal layer 206 to form a cobalt-titanium alloy. Such cobalt-titanium alloy may have a substantially high density and may isolate the remaining metal layer 206 from the diffusion ions in the plug layer 210. The remaining metal layer 206 may be prevented from being in contact with the diffusion ions, which may avoid the violent reaction between the remaining metal layer 206 and the diffusion ions, may not cause damages on the formed plug layer 210, and may improve the quality of the formed plug layer.

In one embodiment, after performing the annealing treatment, a barrier layer 211 covering the metal silicide layer 205 may be formed. The barrier layer 211 may be disposed between the metal silicide layer 205 and the adhesion layer 208. The barrier layer 211 may be the reaction product of the remaining metal layer 206 and the reaction layer 207. The barrier layer 211 may be made of the titanium-silicon alloy or the cobalt-titanium alloy.

Correspondingly, the present disclosure also provides a semiconductor device. Referring to FIG. 10, the semiconductor device may include a substrate 200, and a dielectric layer 203 disposed over the substrate 200. The dielectric layer 203 may contain a contact hole 204, and a bottom of the contact hole 204 may expose a surface of the substrate 200. The semiconductor device may also include a metal silicide layer 205 disposed on the surface of the substrate 200 exposed by the bottom of the contact hole 204. Further, the semiconductor device may include a barrier layer 211 disposed over the surface of the metal silicide layer 205, and a plug layer 210 disposed on the barrier layer 211 and fully filling the contact hole 204.

In one embodiment, the barrier layer 211 may isolate the plug layer 210 from the surface of the metal silicide layer 205, which may block the diffusion ions in the plug layer 210, and may prevent damages on the plug layer 210 due to interaction between the diffusion ions and any other material. Therefore, the quality of the formed plug layer 210 may be improved, and accordingly, the electrical performance and quality of the formed semiconductor device may be improved.

In one embodiment, the semiconductor device may further include an adhesion layer 208. The adhesion layer 208 may be disposed between the barrier layer 211 and the plug layer 210.

In one embodiment, the adhesion layer 208 may serve as a transition layer to provide a desired formation interface for subsequently formed plug layer, thereby improving the quality of the ultimately formed plug layer. In addition, the adhesion layer 208 may block the diffusion ions in the plug layer, and may prevent metal atoms of the plug layer from diffusing into the dielectric layer.

In one embodiment, a thickness of the adhesion layer 208 may be in a range of approximately 5 Å-15 Å. When the thickness of the adhesion layer 208 is less than 5 Å, the thickness of the formed adhesion layer 208 may be too thin and may not serve as the transition layer when forming the plug layer, the formed plug layer may not be sufficiently adhered to the surface of the contact hole 204, and a gap may be formed, which may cause poor quality of the formed plug layer, may not prevent the metal atoms of the plug layer from diffusing into the dielectric layer, and may affect the quality of the ultimately formed semiconductor device.

When the thickness of the adhesion layer 208 is greater than 15 Å, the thickness of the formed adhesion layer 208 may be too thick, although the adhesion layer may serve as a desired transition layer to provide a desired formation interface for subsequently formed plug layer and to prevent metal atoms of the plug layer from diffusing into the dielectric layer, the Rs value and Rc value of the formed semiconductor device may increase, thereby reducing the electrical performance of the formed semiconductor device.

The barrier layer 211 may be made of the titanium-silicon alloy or the cobalt-titanium alloy. In one embodiment, after performing the annealing treatment, the barrier layer 211 may be formed between the metal silicide layer 205 and the adhesion layer 208. The barrier layer 211 may be the reaction product of a remaining metal layer and a reaction layer. The reaction layer may be made of silane, silicon or cobalt, and the remaining metal layer may be made of titanium, such that the barrier layer 211 may be made of the titanium-silicon alloy or the cobalt-titanium alloy.

The disclosed embodiments may have following beneficial effects. In the disclosed embodiments of the present disclosure, the barrier layer may be formed on the metal silicide layer, and the barrier layer may cover the surface of the metal silicide layer. The plug layer may be formed on the barrier layer, and the plug layer may fully fill the contact hole. The metal silicide layer may be isolated from the plug layer by the barrier layer, which may prevent the metal silicide layer from reacting with the diffusion ions in the plug layer to cause damages on the plug layer, thereby improving the quality of the formed plug layer, and improving the electrical performance and use performance of the formed semiconductor device.

Further, forming the metal silicide layer and the barrier layer may include: forming the metal layer on the surface of the substrate exposed by the contact hole, forming the reaction layer on the metal layer, forming the plug layer over the reaction layer, and performing an annealing treatment after forming the plug layer. Therefore, a high-quality plug layer may be formed, and the electrical performance and use performance of the formed semiconductor device may be improved. After the metal layer is formed on the surface of the substrate, the metal layer may interact with the substrate to form the metal silicide layer. In view of this, there may be the remaining metal layer, and the remaining metal layer may continue to react with the reaction layer, thereby using up the remaining metal layer. Therefore, the remaining metal layer may not react with the diffusion ions in the plug layer, which may effectively prevent damages on the plug layer due to the reaction between the diffusion ions and the remaining metal layer, thereby improving the quality of the formed plug layer, and accordingly, improving the electrical performance and use performance of the formed semiconductor device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
   a substrate;
   a dielectric layer, disposed over the substrate, wherein the dielectric layer contains a contact hole, and a bottom of the contact hole exposes a surface of the substrate;
   a metal silicide layer, disposed on the surface of the substrate exposed by the bottom of the contact hole;
   a barrier layer, disposed on a surface of the metal silicide layer, the barrier layer being made of a material including a titanium-silicon alloy or a cobalt-titanium alloy; and
   a plug layer, disposed over the barrier layer and fully filling the contact hole.

2. The semiconductor device according to claim 1, further including:
   an adhesion layer, disposed between the barrier layer and the plug layer.

3. The semiconductor device according to claim 2, wherein:
   a thickness of the adhesion layer is in a range of approximately 5 Å-15 Å.

4. The semiconductor device according to claim 1, wherein:
   the plug layer is made of a material including tungsten.

5. A fabrication method of a semiconductor device, comprising:
   forming a dielectric layer on a substrate;
   forming a contact hole in the dielectric layer by etching the dielectric layer, wherein a bottom of the contact hole exposes a surface of the substrate;
   forming a metal silicide layer and a barrier layer over the substrate exposed by the bottom of the contact hole, wherein the barrier layer covers a surface of the metal silicide layer, and the barrier layer is made of a material including a titanium-silicon alloy or a cobalt-titanium alloy; and
   forming a plug layer over the barrier layer, wherein the plug layer fully fills the contact hole.

6. The method according to claim 5, wherein forming the metal silicide layer and the barrier layer includes:
   forming a metal layer on the surface of the substrate exposed by the bottom of the contact hole,
   forming a reaction layer on the metal layer, and
   after forming the plug layer over the reaction layer, performing an annealing treatment to form the metal silicide layer on the surface of the substrate and the barrier layer covering the metal silicide layer.

7. The method according to claim 6, wherein:
   the reaction layer is made of silane, silicon or cobalt.

8. The method according to claim 7, wherein:
   when the reaction layer is made of silane, process parameters for forming the reaction layer include:
   a gas including silane, wherein a flow rate of silane is in a range of approximately 100 sccm-3000 sccm,
   a reaction temperature in a range of approximately 200° C.-500° C., and
   a reaction pressure in a range of approximately 5 torr-50 torr.

9. The method according to claim 7, wherein:
   when the reaction layer is made of silicon or cobalt, forming the reaction layer includes a chemical vapor deposition process, an atomic layer deposition process, or a physical vapor deposition process.

10. The method according to claim 5, before forming the plug layer, further including:
    forming an adhesion layer on the barrier layer and on a sidewall of the contact hole.

11. The method according to claim 10, wherein forming the plug layer includes:
    forming a plug seed layer on the adhesion layer,
    forming an initial plug layer on the plug seed layer, and
    planarizing the initial plug layer, the plug seed layer and the adhesion layer until a surface of the dielectric layer is exposed, to form the plug layer in the contact hole.

12. The method according to claim 10, wherein:
a thickness of the adhesion layer is in a range of approximately 5 Å-15 Å.

13. The method according to claim 11, wherein:
a thickness of the plug seed layer is less than 15 Å.

14. The method according to claim 10, wherein:
after forming the adhesion layer and before forming the plug layer, an annealing treatment is performed on the substrate to form the metal silicide layer on the surface of the substrate.

15. The method according to claim 6, wherein process parameters of the annealing treatment include:
a gas including nitrogen, wherein a flow rate of nitrogen is in a range of approximately 500 sccm-3000 sccm, and
a temperature in a range of approximately 600° C.-1200° C.

16. The method according to claim 5, wherein:
the plug layer is made of a material including tungsten.

17. The method according to claim 6, wherein:
the metal layer is made of a material including titanium.

18. The method according to claim 5, wherein forming the contact hole includes:
one or more of a dry etching process and a wet etching process.

* * * * *